(12) United States Patent
LaRoche et al.

(10) Patent No.: US 9,761,445 B2
(45) Date of Patent: *Sep. 12, 2017

(54) METHODS AND STRUCTURES FOR FORMING MICROSTRIP TRANSMISSION LINES ON THIN SILICON CARBIDE ON INSULATOR (SICOI) WAFERS

(71) Applicant: Raytheon Company, Waltham, MA (US)

(72) Inventors: Jeffrey R. LaRoche, Austin, TX (US); Kelly P. Ip, Lowell, MA (US); Thomas E. Kazior, Sudbury, MA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/082,500

(22) Filed: Mar. 28, 2016

(65) Prior Publication Data

US 2016/0211136 A1    Jul. 21, 2016

Related U.S. Application Data

(63) Continuation-in-part of application No. 14/105,497, filed on Dec. 13, 2013, now Pat. No. 9,331,153.

(51) Int. Cl.
*H01L 29/20* (2006.01)
*H01L 21/02* (2006.01)
(Continued)

(52) U.S. Cl.
CPC ...... *H01L 21/0254* (2013.01); *H01L 21/6835* (2013.01); *H01L 21/76251* (2013.01);
(Continued)

(58) Field of Classification Search
CPC ....... H01L 2924/00; H01L 2924/13091; H01L 2924/0002; H01L 2924/1305;
(Continued)

(56) References Cited

U.S. PATENT DOCUMENTS

2003/0020069 A1   1/2003   Holmes et al.
2006/0226415 A1   10/2006  Nishijima et al.
(Continued)

FOREIGN PATENT DOCUMENTS

EP        2 546 883 A2       1/2013
WO     WO 2015/088674 A1    6/2015

OTHER PUBLICATIONS

Alessio Pantellini et al.:"Thermal behavior of AlGaN/GaN HEMT on silicon Microstrip technology" Microwave Intergrated Circuits Confrence (EUMIC), 2011 European,IEEE, Oct. 10, 2011 (Oct. 10, 2011), pp. 132-135, XP032073166, ISBN: 978-1-61284-236-3 Section II:"Fabrication Process".

(Continued)

*Primary Examiner* — Robert Bachner
(74) *Attorney, Agent, or Firm* — Daly, Crowley, Mofford & Durkee, LLP

(57) ABSTRACT

A method for providing a semiconductor structure includes: providing a structure having: layer comprising silicon, such as a layer of silicon or silicon carbide; a bonding structure; and silicon layer, the bonding structure being disposed between the layer comprising silicon and the silicon layer, the silicon layer being thicker than the layer comprising silicon; and, a Group III-V layer disposed on an upper surface of the layer comprising silicon; forming a Group III-V device in the III-V layer and a strip conductor connected to the device; removing silicon layer and the bonding structure to expose a bottom surface of layer comprising silicon; and forming a ground plane conductor on the exposed bottom surface of the layer comprising silicon to provide, with the strip conductor and the ground plane conductor, a microstrip transmission line.

12 Claims, 14 Drawing Sheets

(51) Int. Cl.
　　　*H01L 21/762*　　(2006.01)
　　　*H01L 23/66*　　(2006.01)
　　　*H01L 21/683*　　(2006.01)
　　　*H01L 21/8258*　　(2006.01)
　　　*H01P 11/00*　　(2006.01)

(52) U.S. Cl.
　　　CPC .......... *H01L 23/66* (2013.01); *H01L 29/2003* (2013.01); *H01L 21/8258* (2013.01); *H01L 2221/68327* (2013.01); *H01L 2224/32145* (2013.01); *H01L 2924/0002* (2013.01); *H01P 11/003* (2013.01)

(58) Field of Classification Search
　　　CPC ........... H01L 27/11521; H01L 27/1203; H01L 2924/00014; H01L 2924/12032; H01L 2924/13062; H01L 29/66825; H01L 29/7835; H01L 29/66659
　　　See application file for complete search history.

(56) References Cited

U.S. PATENT DOCUMENTS

| | | |
|---|---|---|
| 2009/0050939 A1 | 2/2009 | Briere |
| 2011/0180857 A1 | 7/2011 | Hoke et al. |
| 2013/0221433 A1 | 8/2013 | Molin et al. |

OTHER PUBLICATIONS

Search Report and Written Opinion dated Jan. 20, 2015 for International PCT Application No. PCT/US2014/064019; 13 pages.
Notification of Transmittal of the International Search Report and the Written Opinion of the International Searching Authority, or the Declaration, PCT/US2017/019575, dated May 29, 2017, 1 page.
International Search Report, PCT/US2017/019575 dated May 29, 2017, 4 pages.
Written Opinion of the International Searching Authority, PCT/US2017/019575 dated May 29, 2017, 7 pages.

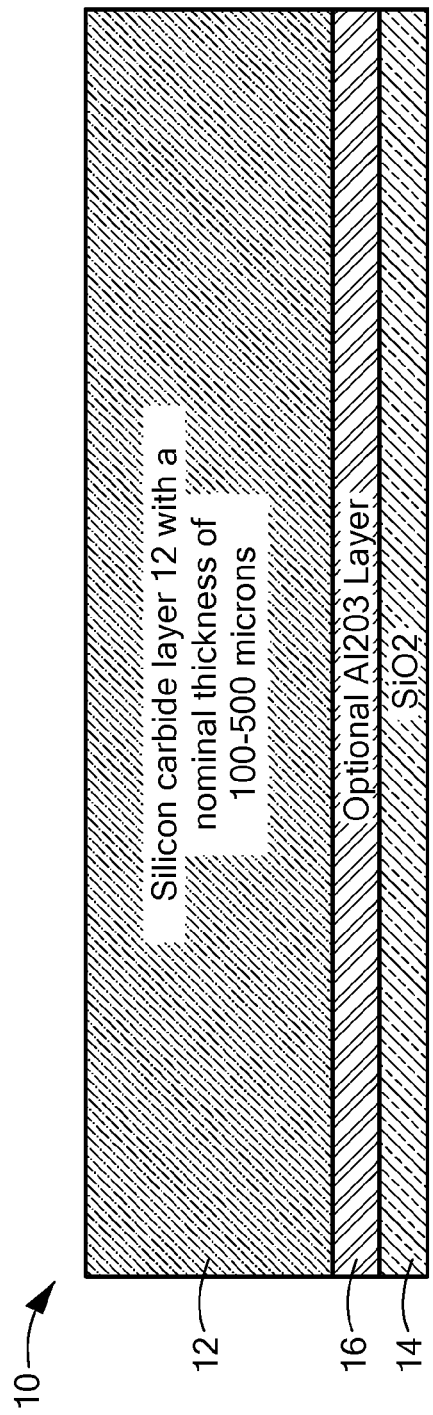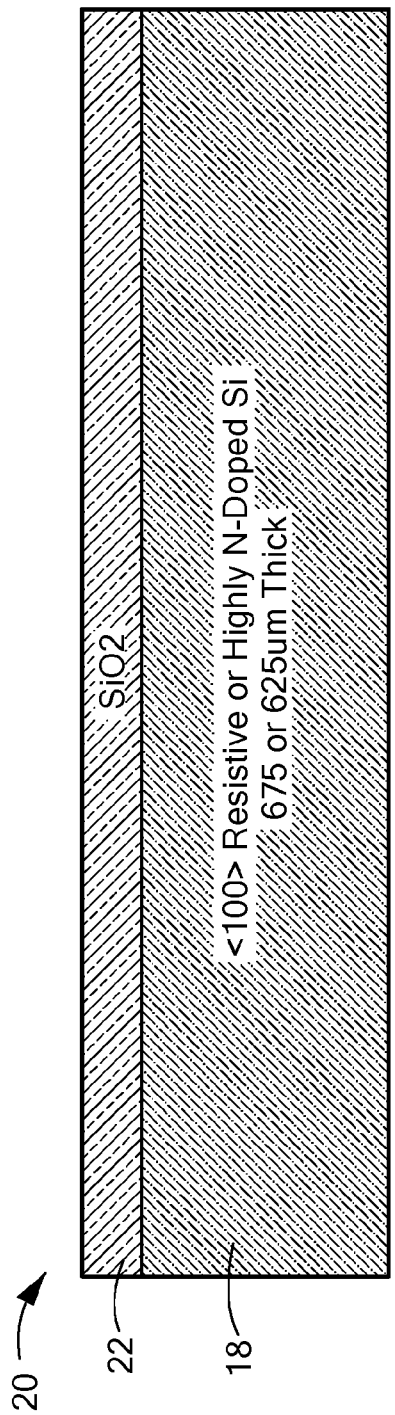
FIG. 1A
FIG. 1B

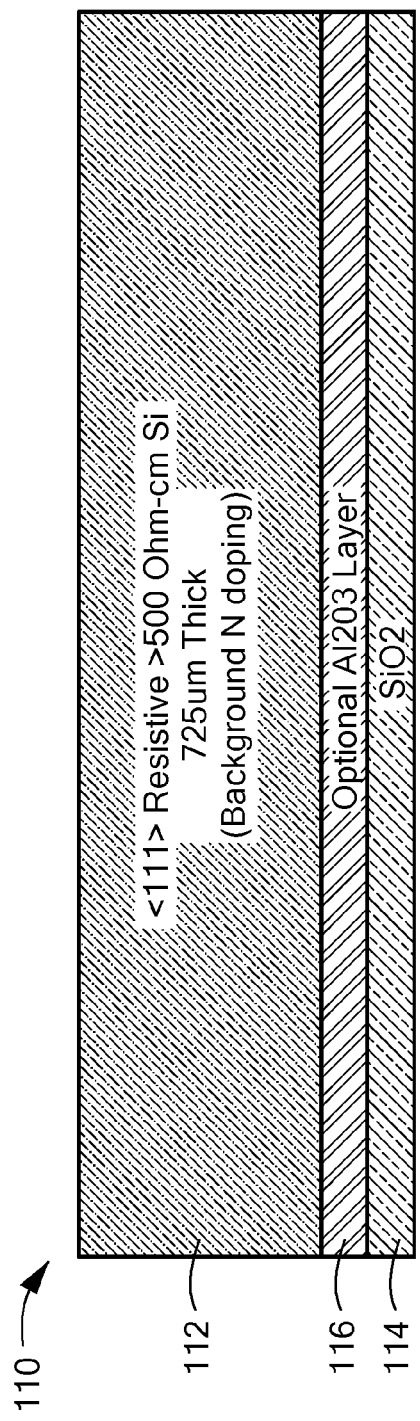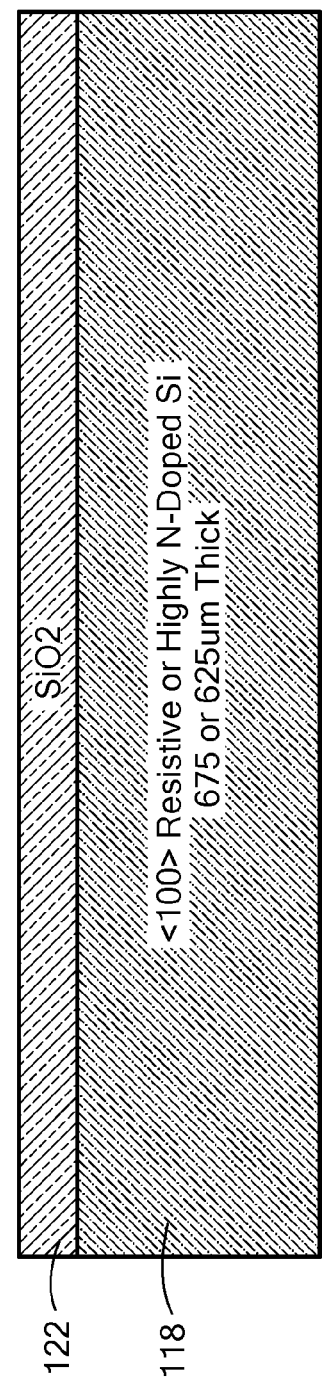
FIG. 3A
FIG. 3B

METHODS AND STRUCTURES FOR FORMING MICROSTRIP TRANSMISSION LINES ON THIN SILICON CARBIDE ON INSULATOR (SICOI) WAFERS

CROSS REFERENCE TO RELATED APPLICATION

This application is a Continuation-In-Part of U.S. patent application Ser. No. 14/105,497 entitled METHODS AND STRUCTURES FOR FORMING MICROSTRIP TRANSMISSION LINES ON THIN SILICON ON INSULATOR (SOI) WAFERS, filed Dec. 13, 2013, which is incorporated herein by reference in its entirety.

TECHNICAL FIELD

This disclosure relates generally to semiconductor structures and manufacturing methods and more particular to methods and structures for forming microstrip transmission lines on thin Group III-V wafers, such as GaN on Silicon Carbide On Insulator (SOI) wafers.

BACKGROUND

As is known in the art, it is sometimes desirable to form Group III-V devices on a substrate as a Monolithic Microwave Integrated Circuit (MMIC). One such substrate is silicon, as described in the above-referenced copending U.S. patent application Ser. No. 14/105,497, filed Dec. 13, 2015, and other substrate is a silicon carbide (SiC) wafer, for example a four inch wafer of silicon carbide, having a thickness of about 400-500 microns, with a semiconductor layer of Group III-V material, such as GaN epitaxial layers formed on the upper surface using MOCVD or MBE.

As is also known is the art, microstrip transmission lines are sometimes used to interconnect active devices, such FET devices, and passive devices formed on, or in, the Group III-V layer. In one such case, after forming the FET and strip conductors of the microstrip transmission lines, the 400-500 micron thick SiC wafer must be thinned or polished to a thickness of 50-100 microns for: the ground plane conductor microstrip transmission line which will be formed on the backside of the silicon carbide wafer; and, to accommodate conductive vias which pass through the silicon carbide wafer from the ground plane to electrodes of the FET. The process of thinning or polishing the backside of the wafer and formation of the vias from the backside of the wafer, however, are difficult to control. Further, the high cost of bulk SiC wafers acts as an impediment to wafer scaling (in the near term) as a 200 mm wafer will necessarily have to be thicker than a 150 mm wafer or 100 mm wafer in order to mitigate potential wafer breakage.

As is further known in the art, ohmic contacts are required in forming source and drain contacts for the FETs. To form these ohmic contacts, a rapid thermal anneal (RTA) process is used to anneal the contact metal to the semiconductor layer. The RTA process typical uses optical lamps to heat the surface of the wafer with the contact metal on the portions of the semiconductor layer where the ohmic contacts are formed. Because the SiC and GaN are optically clear (wide bandgap), absorption of the energy during rapid thermal anneal (RTA) of metal source and drain contacts becomes front mask/pattern dependent. This in turn leads to inconsistent ohmic contact results. Various approaches have been tried to deal with this issue. In one commonly used technique, the wafers are placed in a graphite susceptor which is heated by the lamps and the heat is absorbed by the susceptor is conductively transferred to the wafer to thereby heat the metal contact and form the requisite ohmic anneal. However, front mask/pattern dependent and generally inconsistent Ohmic contact results still often occur. Additionally, in volume production environments with large diameter wafers (e.g. 200 mm) susceptor use is impractical.

SUMMARY

In accordance with the present disclosure a method is provided, comprising: (A) providing a structure having: a layer comprising silicon, such as a silicon layer or a silicon, carbide layer; a bonding structure; and silicon layer, the bonding structure being disposed between the layer comprising silicon and the silicon layer, the silicon layer being thicker than the layer comprising silicon; and, a Group III-V layer disposed on an upper surface of the layer comprising silicon; (B) forming a Group III-V device in the III-V layer and a strip conductor connected to the device; (C) removing silicon layer and the bonding structure to expose a bottom surface of the layer comprising silicon; and (D) forming a ground plane conductor on the exposed bottom surface of the layer comprising silicon to provide, with the strip conductor and the ground plane conductor, a micro-strip transmission line.

In one embodiment a method is provided comprising: providing a structure having: (A) a layer comprising silicon and a first silicon dioxide layer over the layer comprising silicon; and (B) a silicon layer and a second silicon dioxide layer over the silicon layer; the first silicon dioxide layer being bonded to the second silicon dioxide layer; wherein the first silicon dioxide layer and the second silicon dioxide layer provide a bonding structure. The first silicon dioxide layer is bonded to the second silicon dioxide layer and the upper surface of the layer comprising silicon is then polished to reduce its thickness. A Group III-V layer is formed on the upper surface of the thinned layer comprising silicon. A III-V device is formed in the Group III-V layer together with a strip conductor connected to the formed device. The silicon layer and the second silicon dioxide layer are successively removed to expose a bottom surface of the layer comprising silicon. A ground plane conductor is formed on the exposed bottom surface of the layer comprising silicon layer, the strip conductor, the ground plane conductor and a portion of the layer comprising silicon providing a portion of a microstrip transmission line.

In one embodiment, a method is provided comprising: providing a III-V layer formed on an upper surface of a layer comprising silicon, where a bottom of the layer comprising silicon is subsequently polished to reduce its thickness; A first silicon dioxide layer is deposited over the bottom of the layer comprising silicon after thinning to form a structure having: (A) a III-V layer over a layer comprising silicon over a first silicon dioxide layer; and (B) a silicon layer and a second silicon dioxide layer over the silicon layer; with the first silicon dioxide layer being bonded to the second silicon dioxide layer; wherein the first silicon dioxide layer and the second silicon dioxide layer provide a bonding structure. A III-V device is formed in the Group III-V layer together with a strip conductor connected to the formed device. The silicon layer and the second silicon dioxide layer are successively removed to expose a bottom, surface of the layer comprising silicon. A ground plane conductor is formed on the exposed bottom surface of the layer comprising silicon layer, the strip conductor, the ground plane conductor and a portion of the layer comprising silicon providing a portion of a microstrip transmission line.

With such method and structure, a thinner silicon carbide wafer, and therefore less expensive silicon carbide wafer can be sliced from an ingot and the immediately bonded to the silicon handle. Further, by process the silicon wafer with the opaque silicon handle, the RTA process used to form Ohmic contacts is simplified by eliminating the need to use susceptors to suppress the effect of metal pattern density. The SiC wafer can be formed by sawing and polishing (for thicker layers ≥100 μm) or by exfoliation for layers (<100 μm).

The details of one or more embodiments of the disclosure are set forth in the accompanying drawings and the description, below. Other features, objects, and advantages of the disclosure will be apparent from the description and drawings, and from the claims.

DESCRIPTION OF DRAWINGS

FIGS. 1A-1H are diagrammatical cross-sectional sketches of a semiconductor structure at various stages in the fabrication according to the disclosure;

FIGS. 3A-3H are diagrammatical cross-sectional sketches of a semiconductor structure at various stages in the fabrication according to another embodiment of the disclosure.

Like reference symbols in the various drawings indicate like elements.

DETAILED DESCRIPTION

Figure 1C:
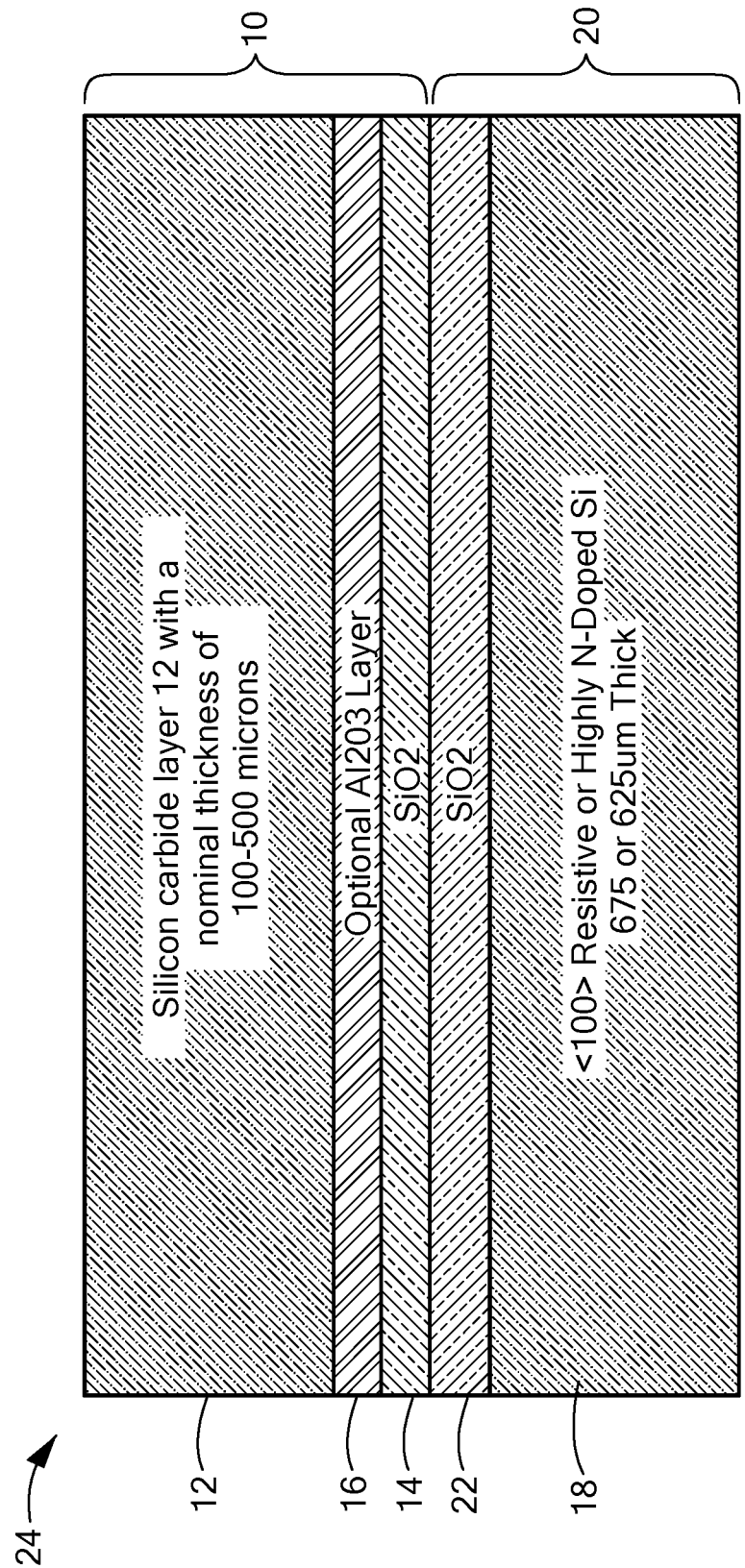
Figure 2:
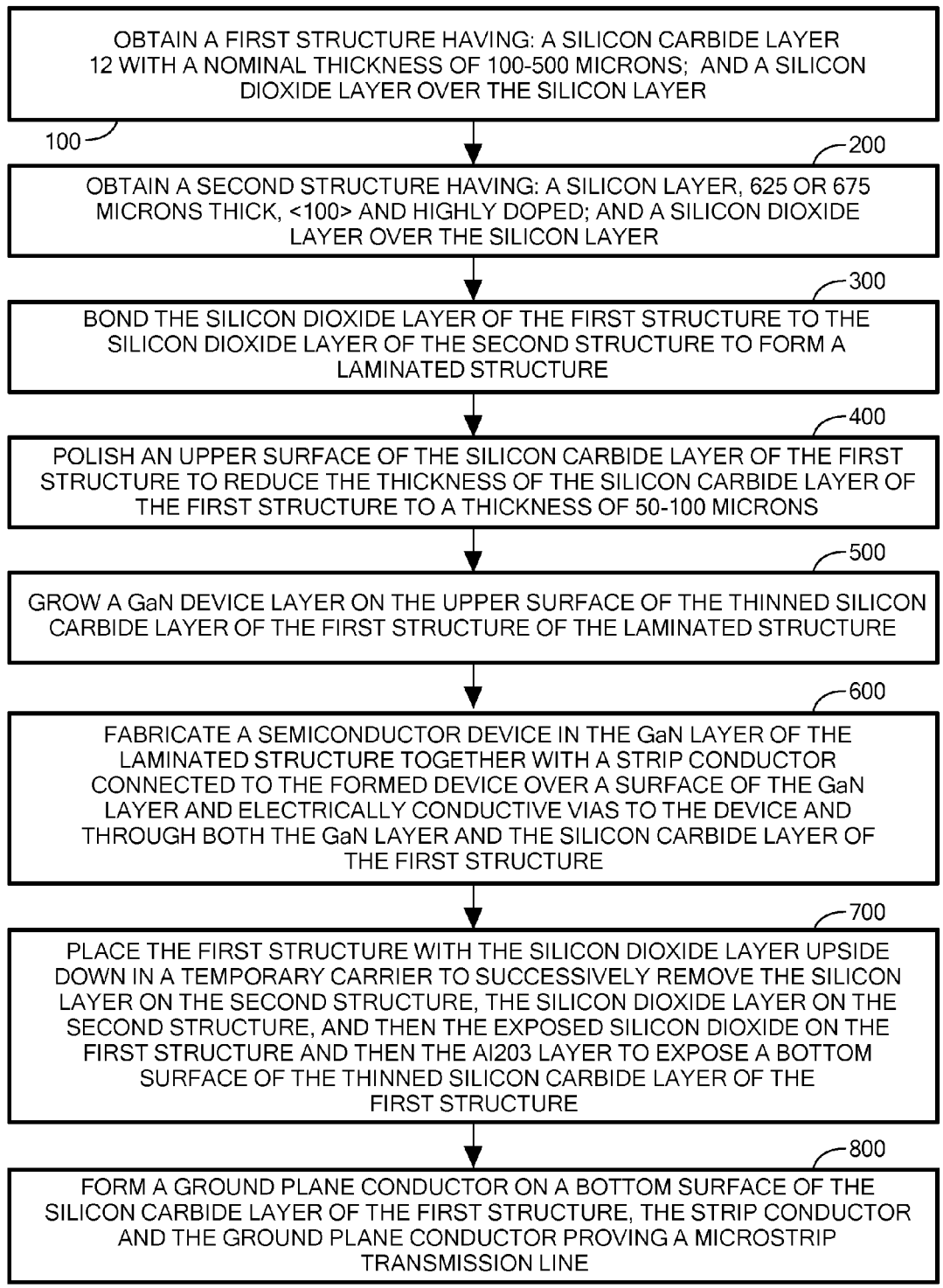
FIG. 2 is a flow chart of a process used to form fee structure of FIGS. 1A-1H in accordance with the disclosure.

Referring ROW to FIG. 1A and step 100 of FIG. 2, a first structure 10 is obtained having: a layer comprising silicon, here a silicon carbide layer 12, here having a nominal thickness of 100-500 microns, with a silicon dioxide layer 14 over the silicon carbide layer 12. An optional etch stop layer 16, here for example, $Al_2O_3$ is may be disposed between the silicon dioxide layer 14 and the silicon carbide layer 12, as shown.

Referring now to FIG. 1B and step 200 of FIG. 2, a second structure 20 is obtained having: a silicon layer 18, here for example 625-675 microns thick, and a silicon dioxide layer 22 over the silicon layer 18.

Referring now to FIG. 1C and step 300 of FIG. 2, the silicon dioxide layer 14 of the first structure 10 is bonded to the silicon dioxide layer 22 of the second structure 20 to form a laminated structure 24.

Figure 1D:
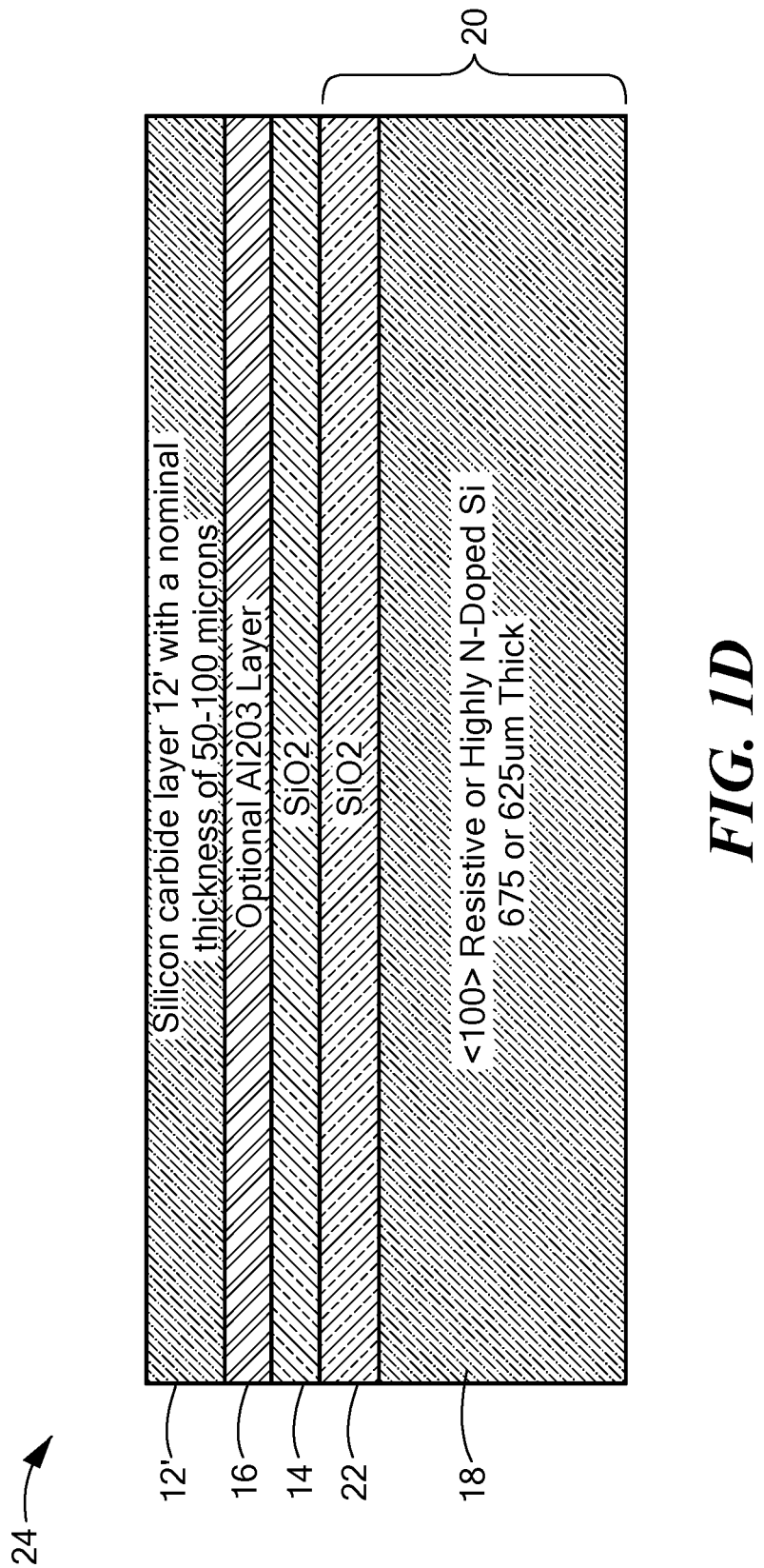

Referring now to FIG. 1D and step 400 of FIG. 2, the upper surface of the silicon carbide layer 12 (FIG. 1C) of the first structure is polished to reduce the layer to a thinner silicon carbide layer 12' (FIG. 1D), here to a thickness of 50-100 micron.

Figure 1E:
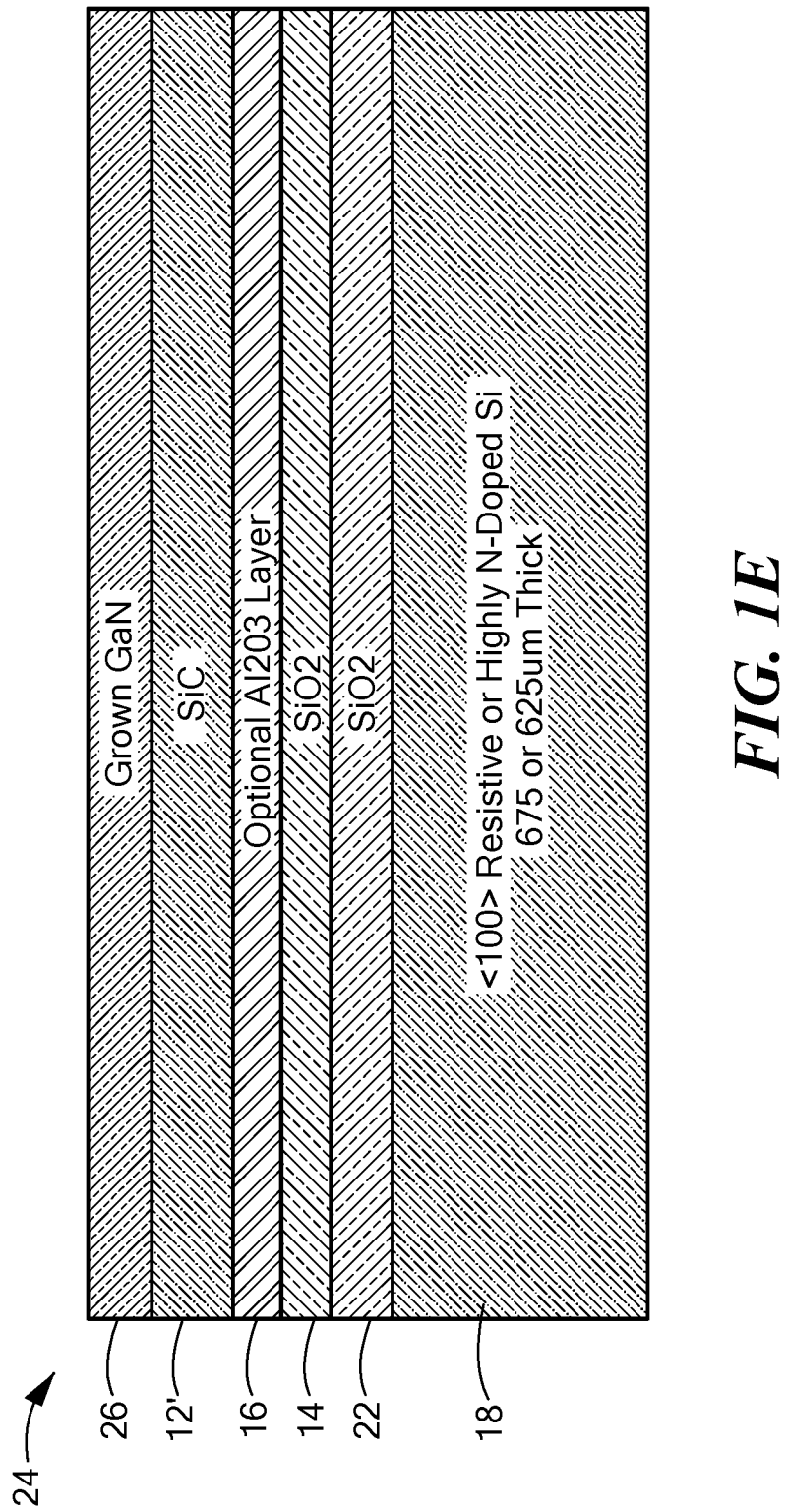

Next, referring to FIG. 1E and step 500 of FIG. 2, a layer 26 of Group III-V material, here for example, GaN, is grown on the upper surface of the thinned silicon carbide layer 12', by, for example, MOCVD or MBE.

Figure 1F:
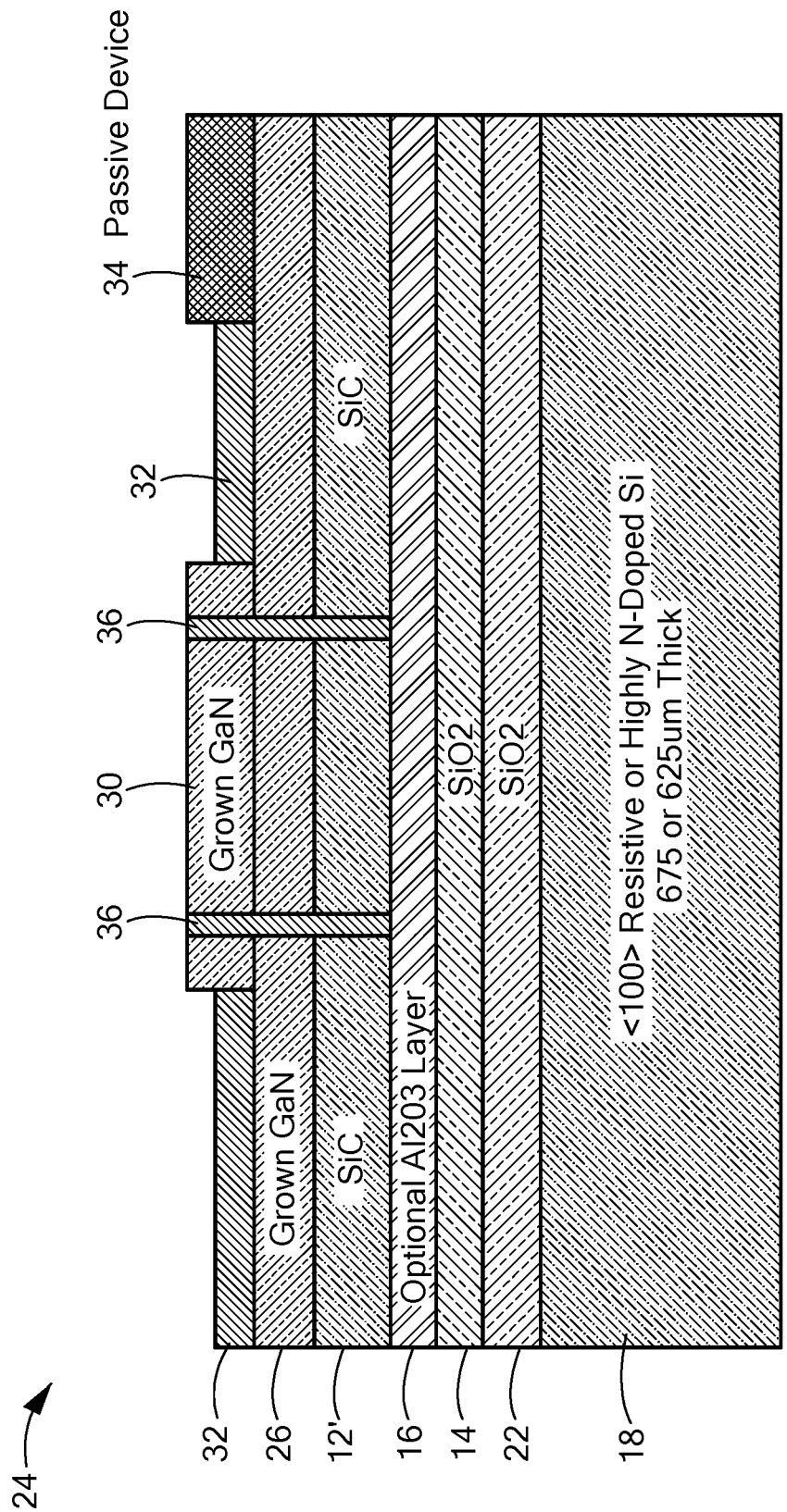

Next, referring to FIG. 1F and step 600 of FIG. 2, a Group III-V device 30, here for example, a GaN HEMT FET active device, is formed in the Group III-V layer 26 along with a strip conductors 32 connected to the device, 26 and a passive device 34 and an electrically conductive vias 36 to electrodes, such as the source electrode not shown of device 26 (it being noted that neither the gate electrode nor drain electrode is shown in FIG. 2) and vertically through the III-V layer 26 and through an underlying portion of the thinner silicon carbide layer 12' finally stopping at the interface of the thinner Si (layer 12') and underlying dielectric which is either $SiO_2$ (layer 14) or the optional $Al_2O_3$ layer (layer 16).

Figure 1G:
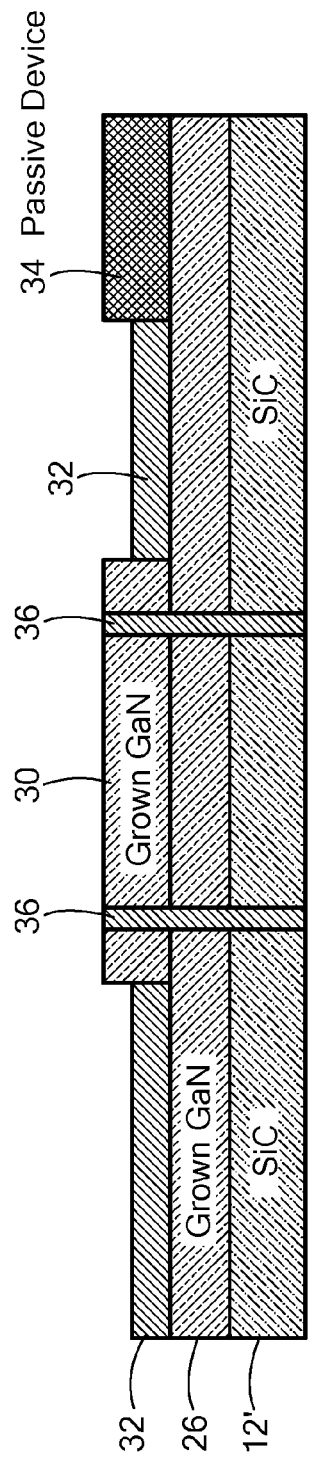

Next, the laminated structure shown in FIG. 1F and step 700 of FIG. 2, is placed upside down in a temporary carrier, not shown, to remove, as by polishing or etching, the silicon layer 18, and then the silicon dioxide layer 22, then the silicon dioxide layer 14 and finally the optional $Al_2O_3$ layer 16 (if present), to expose the bottom surface of the thinned silicon carbide layer 12'. The resulting structure is shown in FIG. 1G.

Figure 1H:
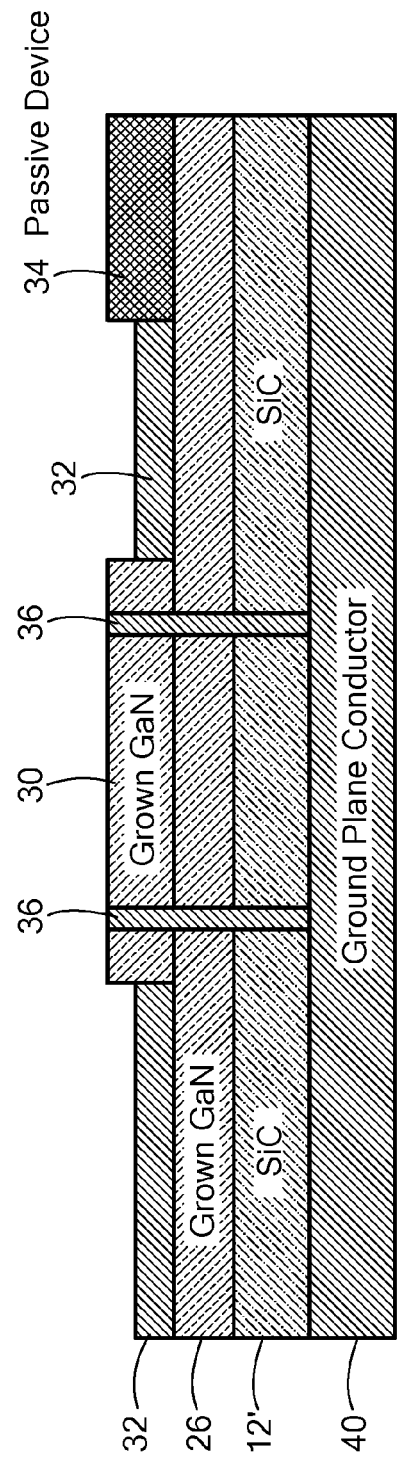

Next, referring to FIG. 1H and step 800 of FIG. 2, a ground plane conductor 40 is formed on a bottom surface of the thinned silicon carbide layer 12'; the strip conductor 32 and the ground plane conductor 40 providing a microstrip transmission line. The completed structure is in most cases then removed from the temporary carrier.

It should be understood that the second Si structure (layer 18) has been designated as 625-675 μm thick (rather than the SEMI International Standards San Jose 3081 Zanker Road San Jose, Calif. 95134, USA conventional 725 μm for 200 mm wafers) in order to compensate for the 100-50 μm the thickness of the first Si structure (layer 12). This is so that the overall thickness of the final bonded wafer stack will be close to the nominal 725 μm semi standard thickness for 200 mm wafers, and therefore avoid wafer handling issues in current, standard processing tools.

Ideally the thickness of the bonded silicon carbide (SiC) layer is the thinnest it can be in order to minimize the amount of expensive SiC needed in forming a SEMI Standard thickness (725 μm thick) 200 mm diameter wafer. Additionally, by limiting the post thinning silicon carbide thickness to 100-50 μm (the thickness of the final Microstrip wafers) the amount of backside processing needed at foundries to facilitate microstrip devices is reduced. That is, the source vias can be etched and metallized from the front side. As a result, only minimal backside processing is needed to facilitate a high yield microstrip process. Furthermore, on insulator wafer fabrication facilities typically have superior control of their top bonded layer thicknesses. As a result, this prefabrication of the microstrip layer thickness at the wafer manufacturer will result in superior wafer thickness uniformity of the resultant microstrip devices fabricated at various foundries (since handle wafers and buried oxide can be removed selectively).

The Si handle wafer (silicon layer 18) also performs several vital functions. First, it provides the 625-675 microns thickness needed, in combination with, silicon carbide layer 12' for the wafer reach a SEMI Standard thickness (725 μm thick), so that it can be handled by standard tools at 200 mm. Additionally, since silicon is not transparent, the Si handle wafer eliminates optical detection based wafer handling issues (during wafer transit in and out of tools). As a result, these wafers will not need to be backside metal coated in order to be detected by wafer handling systems. Finally, the silicon handle wafer (silicon layer 18), rapidly absorbs energy in the RTA processes used during Ohmic contact formation. As a result, control and repeatability of Ohmic contact are improved in the rapid thermal anneal (RTA) systems (that are typically used in gallium nitride (GaN) processing. This is even more important, at large wafer diameters and in volume production environments where susceptors are not typically used.

Figure 3C:
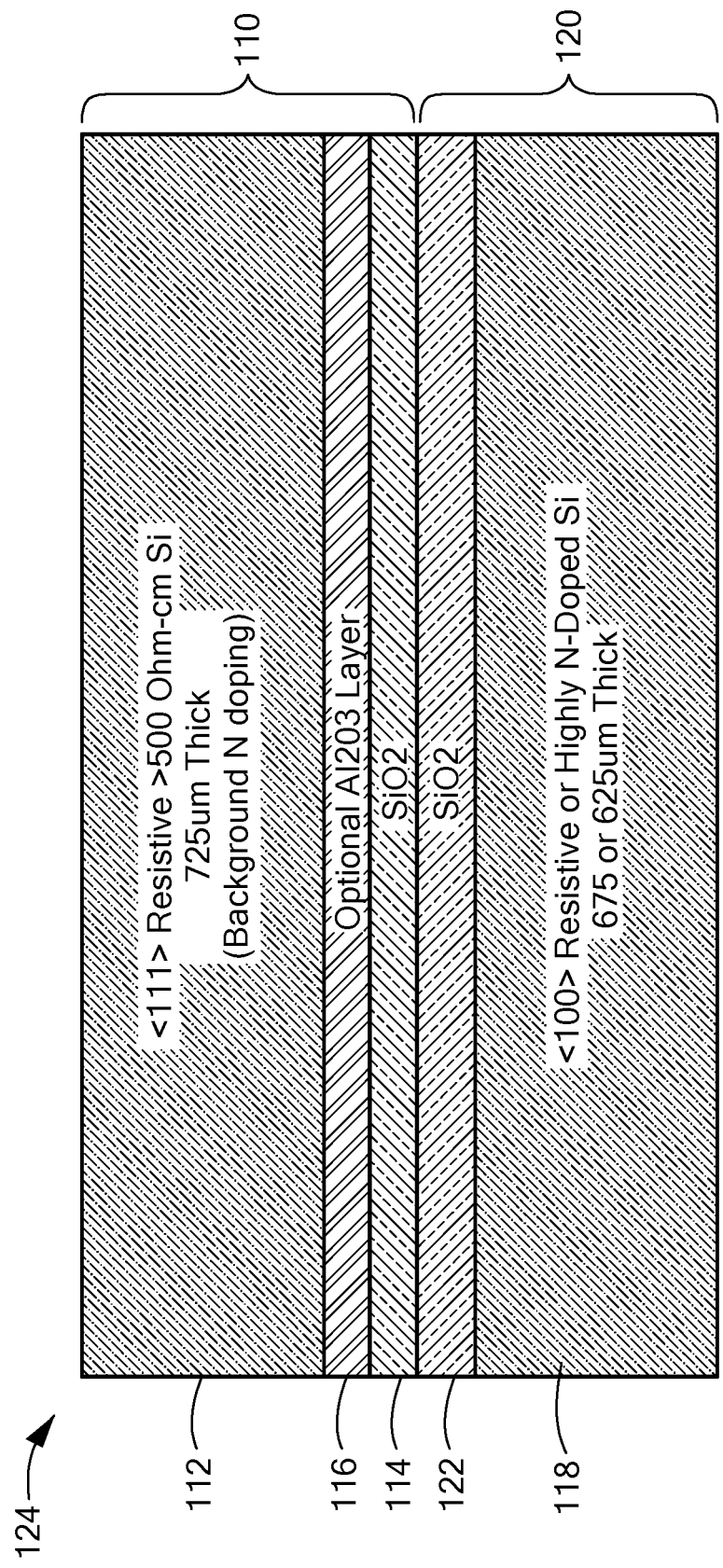
Figure 4:
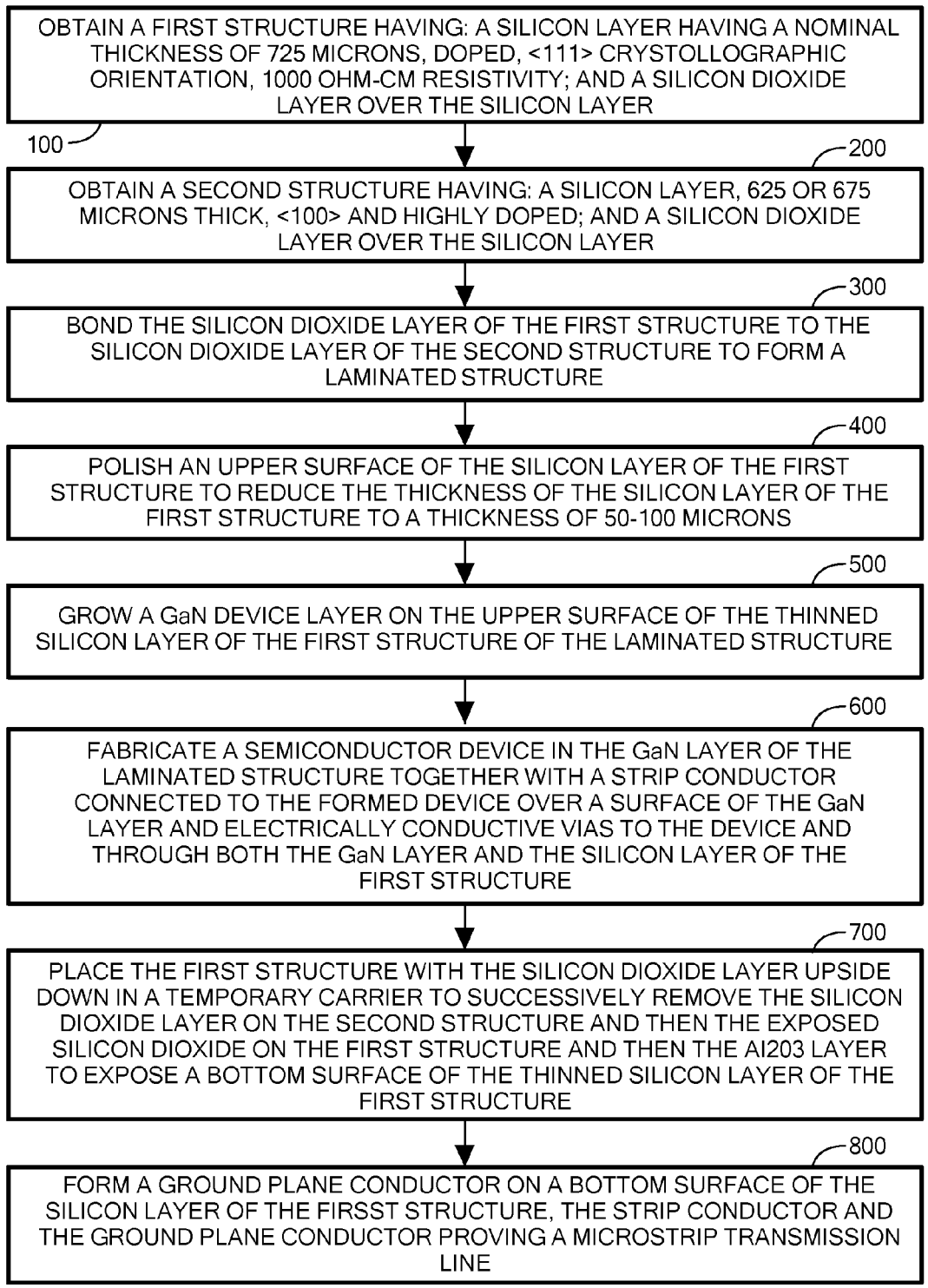
FIG. 4 is a flow chart of a process used to form the structure of FIGS. 3A-3H in accordance with the other embodiment of the disclosure.

Referring now to FIG. 3A and step 100 of FIG. 4, a first structure 110 is obtained having: a layer comprising silicon, here a silicon layer 112 having a <111> crystallographic orientation with a nominal thickness of 100-500 microns and lightly doped, preferably n-type, to have a resistivity >500 ohm-cm. A silicon dioxide layer 114 over the silicon layer 112. An optional etch stop layer 116, here for example, Al$_2$O$_3$ is may be disposed, between the silicon dioxide layer 114 and the silicon layer 112, as shown.

Referring now to FIG. 3B and step 200 of FIG. 4, a second structure 120 is obtained having: a silicon layer 118, 625-675 microns thick, and more highly doped; and a silicon dioxide layer 122 over the silicon layer 118.

Referring now to FIG. 3C and step 300 of FIG. 4, the silicon dioxide layer 114 of the first structure 110 is bonded to the silicon dioxide layer 122 of the second structure 120 to form a laminated structure 124.

Figure 3D:
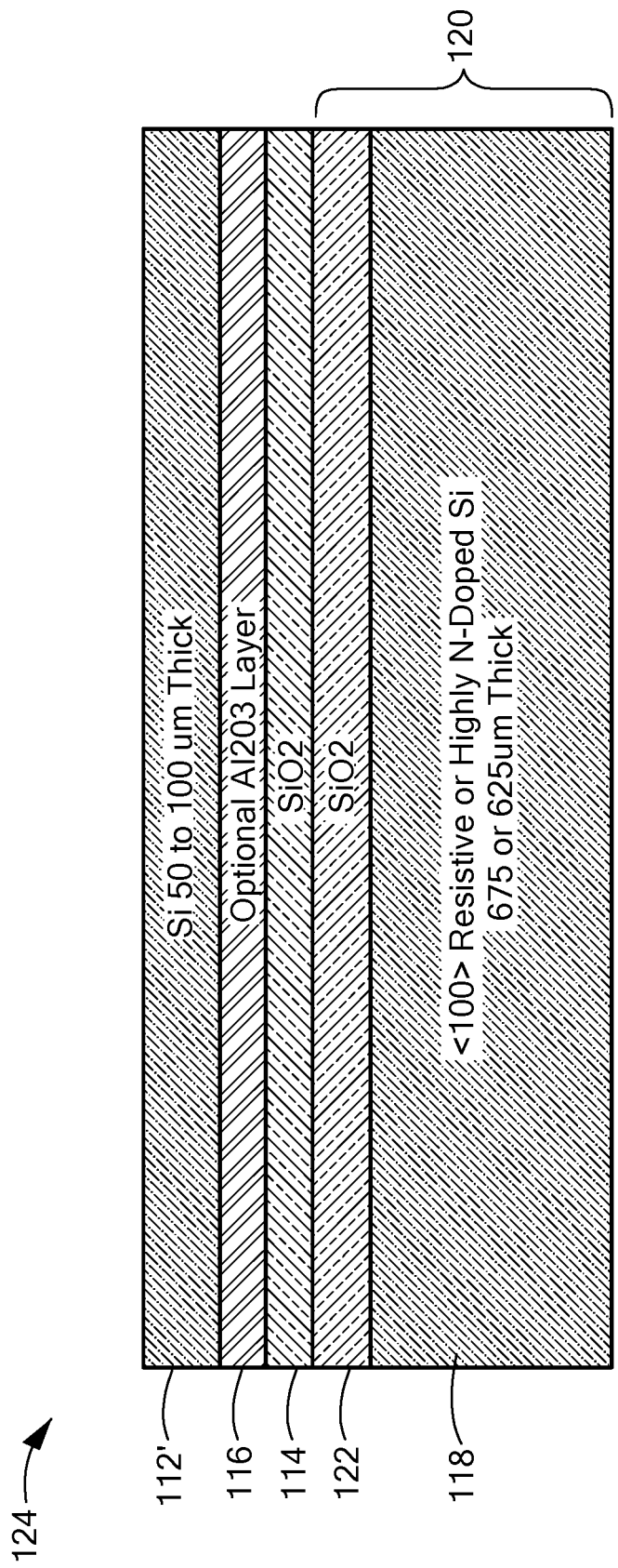

Referring now to FIG. 3D and step 400 of FIG. 4, the upper surface of the silicon layer 112 (FIG. 3C) of the first structure is polished to reduce the thickness of the silicon layer 112 to a thinner silicon layer 112' (FIG. 3D), here to a thickness of 50-100 micron.

Figure 3E:
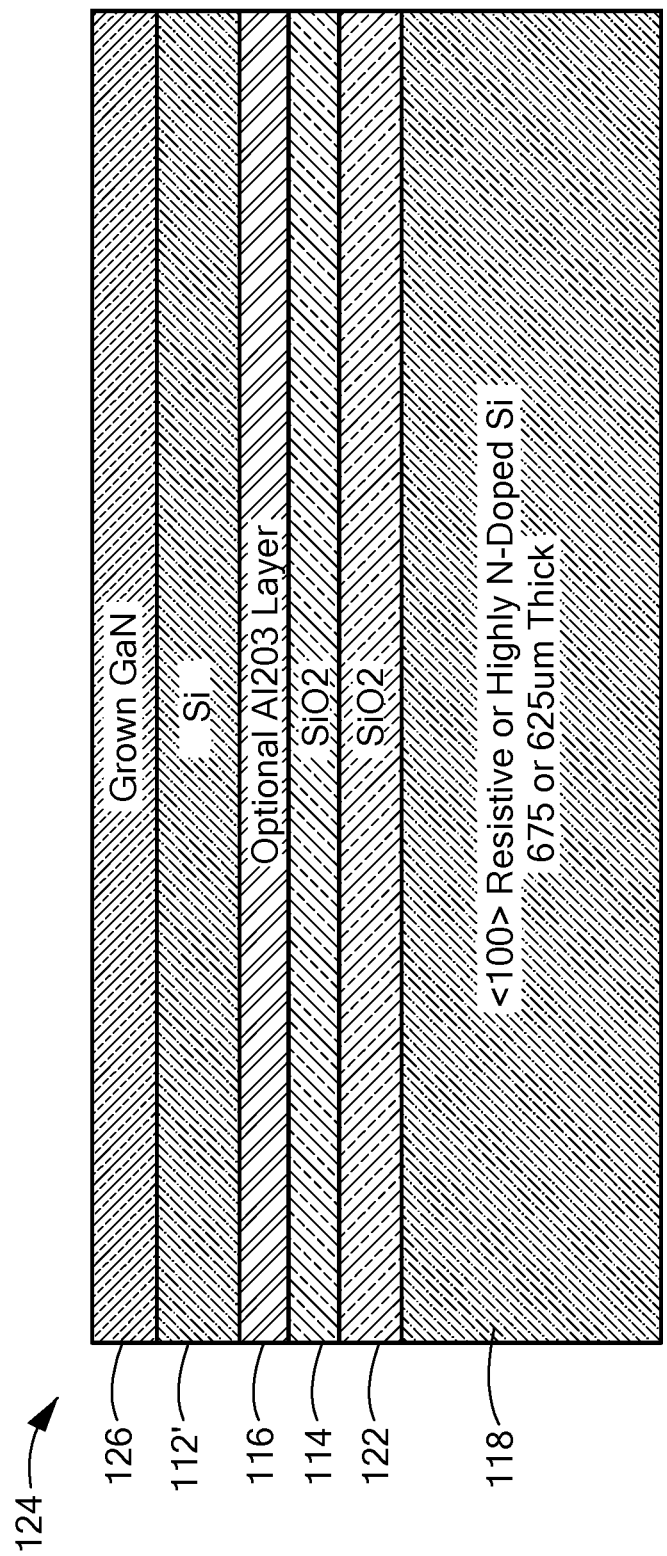

Next, referring to FIG. 3E and step 500 of FIG. 4, a layer 126 of Column III-V material, here for example, GaN, is grown on the upper surface of the thinned silicon layer 112', by, for example, MOCVD or MBE.

Figure 3F:
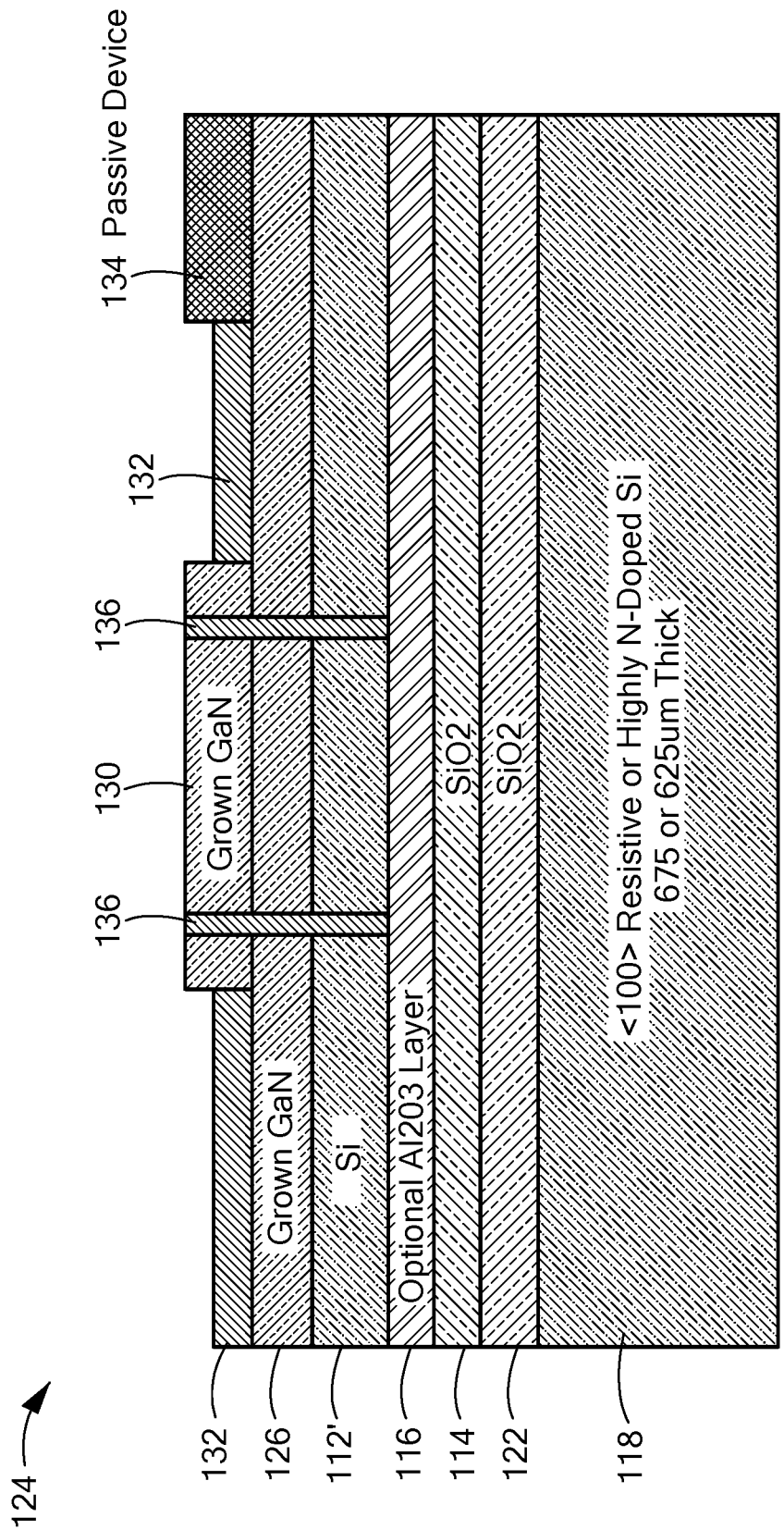

Next, referring to FIG. 3F and step 600 of FIG. 4, a III-V device 130, here for example, a GaN HEMT FET active device is formed in the III-V layer 126 along with a strip conductors 132 connected to the device, 126 and a passive device 134 and an electrically conductive vias 136 to electrodes, such as the source electrode not shown of device 126 (it being noted that neither the gate electrode nor drain electrode is shown in FIG. 3F) and vertically through the III-V layer 126 and through an underlying portion of the thinner silicon layer 112' finally stopping at the Interface of the thinner Si (layer 112') and underlying dielectric which is either SiO$_2$ (layer 114) or the optional Al$_2$O$_3$ layer (layer 1 16).

Figure 3G:
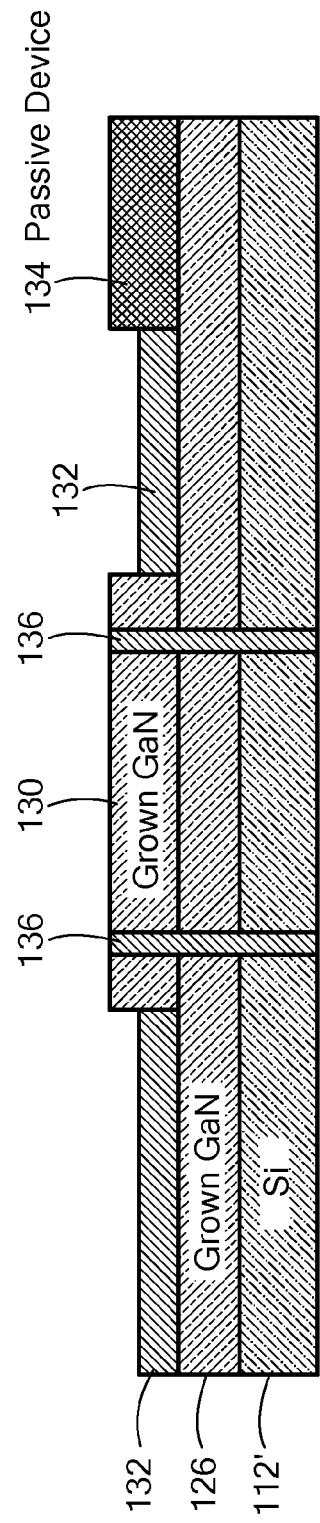

Next, the laminated structure shown in FIG. 3F and step 700 of FIG. 4, is placed upside down in a temporary carrier, not shown, to remove, as by polishing or etching, the silicon layer 118, and then the silicon dioxide layer 122, then the silicon dioxide layer 114 and finally the optional Al$_2$O$_3$ layer 116 (if present), to expose the bottom surface of the thinned silicon layer 112. The resulting structure is shown in FIG. 3G.

Figure 3H:
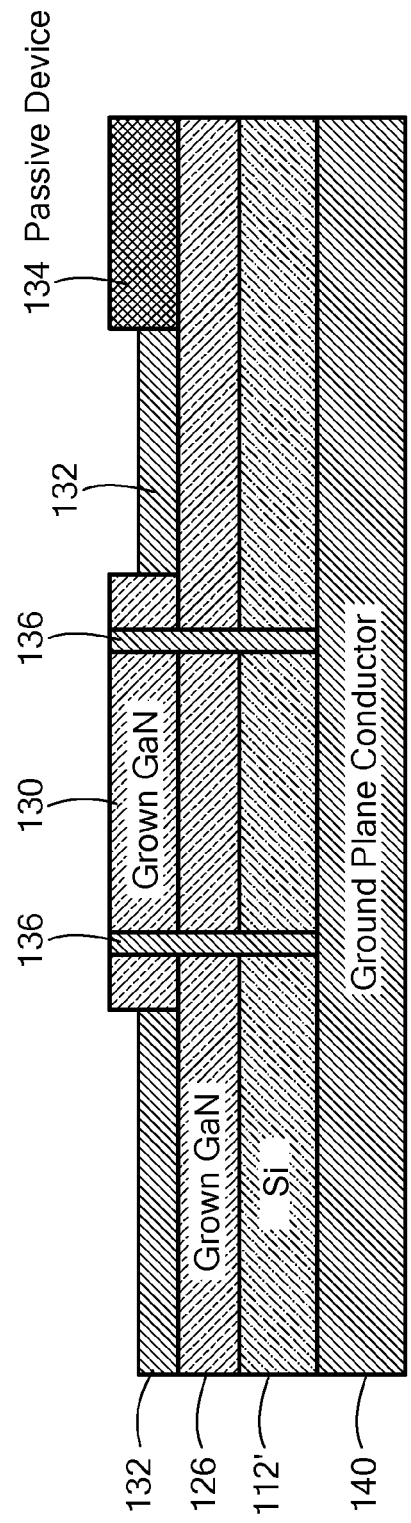

Next, referring to FIG. 3H and step 800 of FIG. 4, a ground plane conductor 140 is formed on a bottom surface of the thinned silicon layer 112'; the strip conductor 132 and the ground plane conductor 140 providing a microstrip transmission line. The completed structure is in most cases then removed from the temporary carrier.

A number of embodiments of the disclosure have been described. Nevertheless, it will be understood that various modifications may be made without departing from the spirit and scope of the disclosure. For example, all the oxide used in wafer bonding may be deposited or grown on either the first silicon carbide (SiC) structure (layer 12) or the Si structure (layer 18) and then bonded to the native oxide of the bare Si or SiC wafer respectively. Additionally the thicknesses of the SiC layer, Si layer, and oxide layer can be changed from those described above and still fall within the spirit and scope of Ibis disclosure. Still further, an additional thin Si layer (typically 1-2 μm) may be bonded on top of the 50-100 μm silicon or silicon carbide and thick 675-625 μm Si substrate to form a tri-layer substrate that would allow CMOS processing and GaN growth in windows (exposed Si regions) and GaN device processing on the same substrate. This in turn would allow for heterogeneously integrated GaN/CMOS circuits. Further, the disclosure can be applied to other embodiments such as those described in FIG. 3 and FIGS. 4A-4K of the above-referenced continuation-in-part of copending U.S. patent application Ser. No. 14/105,497 incorporated herein by reference. Accordingly, other embodiments are within the scope of the following claims.

What is claimed is:
1. A method, comprising:
(A) providing a structure having: a layer comprising silicon; a bonding structure; and silicon layer, the bonding structure being disposed between the layer comprising silicon and the silicon layer, the silicon layer being thicker than the layer comprising silicon; and, a Group III-V layer disposed on an upper surface of the layer comprising silicon;
(B) forming a Group III-V device in the III-V layer and a strip conductor connected to the Group III-V device;
(C) removing a silicon layer and the bonding structure to expose a bottom surface of layer comprising silicon; and
(D) forming a ground plane conductor on the exposed bottom surface of the layer comprising silicon to provide, with the strip conductor and the ground plane conductor, a microstrip transmission line.

2. The method recited in claim 1 wherein the layer comprising silicon is <111> silicon.

3. The method recited in claim 1 wherein the layer comprising silicon is silicon carbide.

4. A method, comprising:
providing a structure having: (A) a layer comprising silicon and a first silicon dioxide layer over a silicon carbide layer; and (B) a silicon layer and a second silicon dioxide layer over the silicon layer; the first silicon dioxide layer being bonded to the second silicon dioxide layer; wherein the first silicon dioxide layer and the second silicon dioxide layer provide a bonding structure;
bonding the first silicon dioxide layer to the second silicon dioxide layer;
growing a Group III-V layer on an upper surface of the layer comprising silicon;
forming an active device in the Group III-V layer together with a strip conductor connected to the formed device;
successively removing the silicon layer and the second silicon dioxide layer to expose a bottom surface of the layer comprising silicon; and
forming a ground plane conductor on the exposed bottom surface of the layer comprising silicon, the strip conductor, the ground plane conductor and a portion of the silicon layer comprising silicon providing a portion of a microstrip transmission line.

5. The method recited in claim 4 wherein the upper surface of the layer comprising silicon of the first structure is polished to reduce the thickness of the layer comprising silicon prior to forming the Group III-V layer.

6. The method recited in claim 4 wherein the layer comprising silicon is <111> silicon.

7. The method recited in claim 4 wherein the layer comprising silicon is silicon carbide.

8. The method recited in claim 5 wherein the layer comprising silicon is silicon.

9. The method recited in claim 5 wherein the layer comprising silicon is silicon carbide.

10. The method recited in claim 4 wherein Group III-V layer is formed on the upper surface of the layer comprising silicon before the bottom surface of the layer comprising silicon is polished to reduce its thickness.

11. The method recited in claim 10 wherein the layer comprising silicon is silicon.

12. The method recited in claim 10 wherein the layer comprising silicon is silicon carbide.

\* \* \* \* \*